(12) United States Patent
Chikamichi

(10) Patent No.: US 7,062,424 B2
(45) Date of Patent: *Jun. 13, 2006

(54) CIRCUIT MODELING USING TOPOLOGICALLY EQUIVALENT MODELS

(75) Inventor: Shoichi Chikamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 605 days.

This patent is subject to a terminal disclaimer.

(21) Appl. No.: 10/304,851

(22) Filed: Nov. 27, 2002

(65) Prior Publication Data

US 2003/0125919 A1 Jul. 3, 2003

Related U.S. Application Data

(62) Division of application No. 09/333,970, filed on Jun. 16, 1999, now Pat. No. 6,519,556.

(30) Foreign Application Priority Data

Jun. 17, 1998 (JP) ................................. 10-169447

(51) Int. Cl.
*G06G 7/48* (2006.01)
*G06F 17/50* (2006.01)

(52) U.S. Cl. ............................. 703/13; 703/14; 703/15

(58) Field of Classification Search ............. 703/13–15
See application file for complete search history.

(56) References Cited

U.S. PATENT DOCUMENTS

| | | | |
|---|---|---|---|
| 3,597,708 A | 8/1971 | Perreault | |
| 3,678,395 A | 7/1972 | Hunton et al. | |
| 5,400,042 A | 3/1995 | Tulintseff | |
| 5,504,423 A | 4/1996 | Fang | |
| 5,545,949 A | 8/1996 | Bacher | |
| 5,600,286 A | 2/1997 | Livingston et al. | |
| 5,621,422 A | 4/1997 | Wang | |
| 6,519,556 B1 * | 2/2003 | Chikamichi | .................. 703/13 |

OTHER PUBLICATIONS

Jong-Gwan Yook et al., "Computation of Switching Noise in Printed Circuit Boards", IEEE Transactions on Components, Packaging, and Manufacturing Technology—Part A, vol. 20, No. 1, Mar. 1997, pp. 64-75.
Levinson: "Investigations of Overvoltage Breakdown" (Master's Thesis); Texas Tech. U.; pp. 45-51; Aug. 1981.
SPICE User's Guide: Table of Contents and section 3; 1983.

(Continued)

*Primary Examiner*—Hugh Jones
(74) *Attorney, Agent, or Firm*—Sughrue Mion, PLLC

(57) ABSTRACT

A modeling method and a simulation method enable a circuit board to undergo modeling without deterioration of simulation precision while describing with no matrix shape. A circuit simulator analyzes power/ground noise of a circuit board with single current change source. A process regards the circuit board as an aggregate of thin doughnut boards of concentric circle shape with the current change source as the center, subsequently, approximating the aggregate of the doughnut boards to be an aggregate of rectangular boards with respective circumferences of the doughnut boards as widths and respective cut-lengths of the same as lengths, then forming respective transmission line models taking respective rectangular boards of the aggregate of the rectangular boards as the transmission line, thus connecting respective transmission line models in series to make it a simulation model of the circuit board.

10 Claims, 13 Drawing Sheets

OTHER PUBLICATIONS

Yoon et al.; "Modeling of monolithic RF spiral transmission-line balun"; IEEE Trans. MTT.; pp. 393-395; Feb. 2001.

Yook et al.; "Computation of switching noise in printed circuit boards"; pp. 64-75; Mar. 1997.

Jones et al.; "Pulsed dielectric breakdown of pressurized water and salt solutions"; J. Appl. Phys.; pp. 795-805; 1996.

Jones et al.; "Nanosecond pre-breakdown and breakdown phenomena in water: influence of pressure, conductivity, and ionic sheath information"; ICDL '96; pp. 360-364; 1996.

Jong-Gwan Yook et al., "Computation of Switching Noise in Printed Circuit Boards", IEEE Transactions on Components, Packaging, and Manufacturing Technology, Part A, Mar. 1997 vol. 20, No. 1, pp. 64-75.

Matthew N. O. Sadiku et al., "A Simple Introduction to the Transmission-Line Modeling", IEEE Transactions on Circuits and Systems, col. 37, No. 8, Aug. 1, 1990, pp. 991-999.

N. Marcuvitz, "Waveguide Handbook", 1951, McGraw-Hill, New York, pp. 29-47.

* cited by examiner

SIMULATION WAVE FORM

EXPERIMENTATION WAVE FORM

| ITEM | POSITION OF DE-COUPLING CAPACITOR | | |
|---|---|---|---|
| | NON | 10mm | 20mm |
| SIMULATION | 342mV | 170mV | 310mV |
| EXPERIMENTATION | 351mV | 219mV | 325mV |

US 7,062,424 B2

CIRCUIT MODELING USING TOPOLOGICALLY EQUIVALENT MODELS

This is a divisional of application Ser. No. 09/333,970 filed Jun. 16, 1999 now U.S. Pat. No. 6,519,556; the disclosure of which is incorporated herein by reference.

BACKGROUND INVENTION

The present invention relates to a modeling method and a simulation method. More to particularly this invention relates to a modeling method for forming a simulation model when analyzing power/ground noise of circuit board, and/or its small area by circuit simulator and to a simulation method for using the simulation model formed.

Description of the Prior Art

With speed up of the computer, power/ground noise occurring in LSI (Large Scaled Integration) package and/or printed circuit board is actualized as hindrance main cause of speed up or as occurrence main cause of EMI (Electromagnetic Interference). Settlement of a more accurate simulation method is desired for reducing power/ground noise.

The power/ground noise $\Delta V$ is determined by the product of current change quantity $\Delta i$ and impedance Z. The current change quantity $\Delta i$ occurs caused by switching of current change source mainly. Further, the impedance Z is impedance between power layer into which the current change quantity $\Delta i$ flows and the ground layer, thus the impedance Z is determined according to structure of LSI package and/or printed circuit board.

To diminish both of the current change quantity $\Delta i$ and the impedance Z is effective for reducing power/ground noise. So, to grasp accurately the current change quantity $\Delta i$ and the impedance Z is necessary for reducing power/ground noise.

For instance, in circuit simulation using SPICE (Simulation Program with Integrated Circuit Emphasis) simulator, it was necessary to describe (modeling) physical structure such as LSI package and/or printed circuit board with electrical element such as transistor model, inductance, capacitance, and resistance whose input form is capable of being understood by the simulator. In particular, in order to improve the precision of the simulation of power layer/ground layer, it was necessary to describe them with the electrical element as small matrix shape. (For instance, referring to Jong-Gwan Yook et al. "Computation of Switching Noise in Printed Circuit Boards", IEEE TRANSACTIONS ON COMPONENTS, PACKAGING, AND MANUFACTURING TECHNOLOGY-PART A, VOL. 20, NO. 1, MARCH 1997).

The first problem is that the modeling of the matrix shape improves precision of the simulation, while the modeling of the matrix shape brings increase of execution time of the simulation. Specially, in the modeling regarding the LSI package using general purpose modeler and/or printed circuit board, in order to balance the simulation precision with the simulation execution time, it is necessary to optimize physical form to be inputted to the modeler artificially corresponding to frequency wanted to analyze, thus considerable knowledge and know-how are necessary.

SUMMARY OF THE INVENTION

In view of the foregoing, it is an object of the present invention in order to overcome the above-mentioned problems, to provide a modeling method capable of forming model without describing circuit board and/or small area of circuit board using matrix shape and without deteriorating simulation precision.

It is another object of the present invention to provide a simulation method, applying above modeling method, capable of realizing simulation of power/ground noise while balancing simulation precision with simulation executing time.

It is still another object of the present invention to provide storage medium storing therein a program for executing above modeling method and/or the simulation method.

According to a first aspect of the present invention, in order to achieve the above mentioned objects, there is provided a modeling method in which a simulation model of a circuit board with one current change source is formed when analyzing power/ground noise of the circuit board by a circuit simulator, comprising the processes of regarding the circuit board as an aggregate of doughnut boards having a form of thin concentric circle with the current change source as the center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, and connecting said transmission line models in series to make said simulation model of the circuit board.

According to a second aspect of the present invention, there is provided a modeling method in which a simulation model of a small area of circuit board having a current change source at a center is formed when analyzing power/ground noise of the small area of circuit board by a circuit simulator, comprising the processes of regarding the small area of circuit board as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in said aggregate of rectangular boards while each rectangular board is a transmission line, and connecting the transmission line models in series to make the simulation model of said small area of circuit board.

According to a third aspect of the present invention, there is provided a simulating method in which a simulation model of a circuit board with one current change source is formed, and a simulation of power/ground noise of the circuit board is executed by a circuit simulator, comprising the processes of regarding the circuit board as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make the simulation model of the circuit board, connecting the current change source to a board center end of the simulation model of the circuit board, connecting an ideal power to a board periphery end of the simulation model of the circuit board, and observing connecting points of the transmission line models while changing the current of the current change source.

According to a fourth aspect of the present invention, there is provided a simulating method in which a simulation model of a circuit board with one current change source is formed, and a simulation of power/ground noise of the circuit board is executed by a circuit simulator, comprising the processes of regarding the circuit board as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make the simulation model of the circuit board, connecting the current change source to a board center end of the simulation model of the circuit board, connecting an ideal power to a board periphery end of the simulation model of the circuit board, connecting a de-coupling capacitor model to a periphery of the current change source, and observing connecting points of the transmission line models while changing the current of the current change source.

According to a fifth aspect of the present invention, there is provided a simulating method in which a simulation model of a small area of circuit board having a current change source at a center is formed, and a simulation of power/ground noise of the small area of circuit board is executed by a circuit simulator, comprising the processes of regarding the small area of circuit board as an aggregate of doughnut boards having a form of thin concentric circles with the current change source as a center, approximating the aggregate of doughnut boards to an aggregate of rectangular boards with respective circumference of the doughnut boards as widths and respective cut-lengths of the same as lengths, forming a transmission line model for each rectangular board in the aggregate of rectangular boards while each rectangular board is a transmission line, connecting the transmission line models in series to make the simulation model of the small area of circuit board connecting the current change source to a region center end of the simulation model of the small area of circuit board, connecting an ideal power to a region periphery end of the simulation model of the small area of circuit board, and observing connecting points of the transmission line models while changing the current of the current change source.

According to a sixth aspect of the present invention, there is provided a simulating method in which a simulation model of a small area of circuit board having a current change source at a center is formed, and a simulation of power/ground noise of the small area of circuit board is executed by a circuit simulator, comprising the processes of regarding the small area of circuit board as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make the simulation model of the small area of circuit board, connecting the current change source to a region center end of the simulation model of the small area of circuit board connecting an ideal power to a region periphery end of the simulation model of the small area of circuit board connecting a de-coupling capacitor model to a periphery of the current change source, and observing connecting points of the transmission line models while changing the current of the current change source.

According to a seventh aspect of the present invention, there is provided a storage medium storing therein a computer implemented program, the computer implemented program implementing the processes of regarding a circuit board with one current change source as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, and connecting the transmission line models in series to make a simulation model of the circuit board.

According to an eighth aspect of the present invention, there is provided a storage medium storing therein a computer implemented program, the computer implemented program implementing the processes of regarding a small area of circuit board having a current change source at a center as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, and connecting the transmission line models in series to make a simulation model of the small area of circuit board.

According to a ninth aspect of the present invention, there is provided a storage medium storing therein a computer implemented program, the computer implemented program implementing the processes of regarding a circuit board with one current change source as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make a simulation model of the circuit board connecting the current change source to a board center end of the simulation model of the circuit board, connecting an ideal power to a board periphery end of the simulation model of the circuit board, and observing connecting points of the transmission line models while changing the current of the current change source.

According to a tenth aspect of the present invention, there is provided a storage medium storing therein a computer implemented program, the computer implemented program implementing the processes of regarding a circuit board with one current change source as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make a simulation model of the circuit board, connecting the current change source to a board center end of the simulation model of the circuit board, connecting an ideal power to a board periphery end of the simulation model of the circuit board, connecting a de-coupling capacitor model to a periphery of the current change source, and observing connecting points of the transmission line models while changing the current of the current change source.

According to an eleventh aspect of the present invention, there is provided a storage medium storing a computer implemented program, the computer implemented program implementing the processes of regarding a small area of circuit board having a current change source at a center as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make a simulation model of the small area of circuit board, connecting the current change source to a region center end of the simulation model of the small area of circuit board, connecting an ideal power to a region periphery end of the simulation model of the small area of circuit board, and observing connecting points of the transmission line models while changing the current of the current change source.

According to a twelfth aspect of the present invention, there is provided a storage medium storing a computer implemented program, the computer implemented program implementing the processes of regarding a small area of circuit board having a current change source at a center as an aggregate of doughnut boards having a form of thin concentric circles with the current change source as a center, approximating the aggregate of doughnut boards to an aggregate of rectangular boards with respective circumferences of the doughnut boards as widths and respective cut-lengths of the same as lengths, forming a transmission line model for each rectangular board in the aggregate of rectangular boards while each rectangular board is a transmission line, connecting the transmission line models in series to make a simulation model of the small area of circuit board, connecting the current change source to a region center end of the simulation model of the small area of circuit board, connecting an ideal power to a region periphery end of the simulation model of the small area of circuit board, connecting a de-coupling capacitor model to a periphery of the current change source, and observing connecting points of the transmission line models while changing the current of the current change source.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

Figures 1A, 1B, 1C:
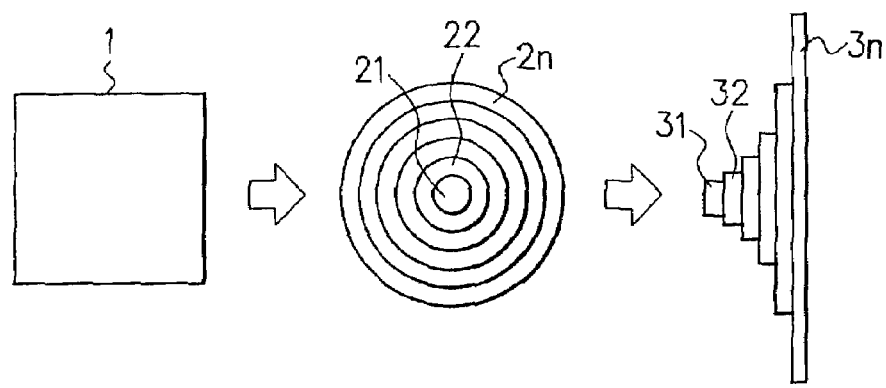
FIGS. 1A to 1D are views showing procedure of order of modeling method according a first embodiment of the present invention.
Figure 1D:
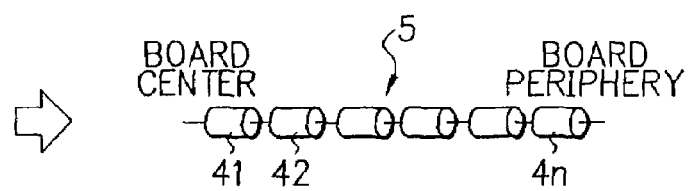

A preferred embodiment of the present invention will be described in detail in accordance with the accompanying drawings.

FIGS. 1A to 1D are views showing procedure of order of modeling method according to a first embodiment of the present invention. In FIGS. 1A to 1D, reference numeral 1 denotes a circuit board, 21 to 2$n$ ($n$ is positive integer number) denote a doughnut board having thin concentric circle with a current change source as a center, 31 to 3$n$ denote a rectangular board with respective circumferences of the doughnut boards 21 to 2$n$ as widths and respective cut-lengths of the same as length thereof, 41 to 4$n$ denote transmission line model formed while calculating characteristic impedance Z0 and propagation delay time τ individually using general purpose impedance calculation tool and so forth while regarding each rectangular board 31 to 3$n$ as a transmission line, 5 denotes a simulation model (circuit board model) of the circuit board 1 to which the transmission line models 41 to 4n are connected in series.

Figure 2:
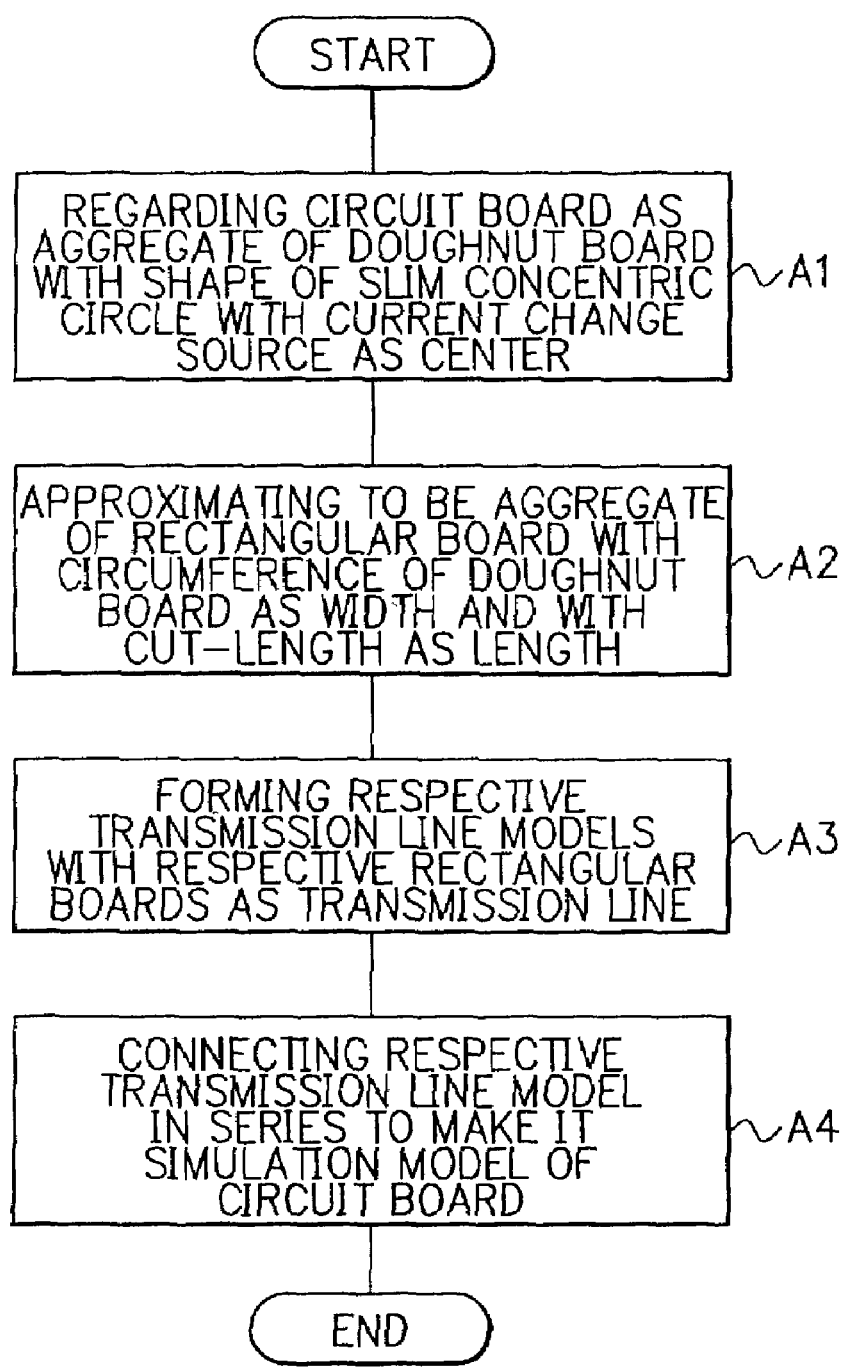
FIG. 2 is a flowchart showing processes of order of the modeling method according to the first embodiment of the present invention.

FIG. 2 is a flowchart showing processes of order of modeling method according to the first embodiment of the present invention. The modeling method comprises a process A1 for regarding the circuit board 1 as aggregate of the doughnut boards 21 to 2n having thin concentric circle with current change source as a center, a process A2 for approximating the doughnut board as aggregate of rectangular boards 31 to 3n with respective circumference of the doughnut boards 21 to 2n as widths, and respective cut-lengths of the same as the lengths thereof, a process A3 for forming respective transmission line models 41 to 4n with respective rectangular boards 31 to 3n as the transmission line, and a process A4 connecting respective transmission line models 41 to 4n to make it simulation model 5 of the circuit board 1.

Next, the modeling method will be described according to the such first embodiment.

Firstly, a current change source is mounted in center thereof. The circuit board 1 which is an ideal power/ground without voltage fluctuation regarding outer periphery thereof is regarded as aggregate of the doughnut boards 21 to 2n with thin concentric circle shape (process A1).

Thus, it is capable of regarding the circuit board 1 as the aggregate of the doughnut boards 21 to 2n with thin concentric circle, because reason is to be capable of being considered regarding flow of current in the circuit board 1. Namely, according to current alteration of the current change source, the current flows toward the board center from the board periphery in a power layer of the circuit board 1 equally, while the current flows out equally from the board center toward board periphery in the ground layer of the circuit board 1. At this time, current quantity does not change in board periphery or in board center, however area within which the current flows decreases gradually in the direction from the board periphery to the board center with shape of the concentric circle (doughnut shape). For that reason, the circuit board is capable of being regarded as the aggregate of the doughnut boards 21 to 2n.

Next, the doughnut boards 21 to 2n are approximated to be the aggregate of rectangular boards 31 to 3n with the outer periphery (or inner periphery, or summing average thereof being available ) as the width and the cut-length being taken as length (process A2). The cut-length is division width (=outer radius−inner radius) when the circuit board is divided into the thin doughnut boards with concentric circle shape.

In the process A1, the doughnut boards 21 to 2n are thin, because in the process A2, it becomes easy to approximate to rectangular shape when approximating respective doughnut boards 21 to 2n to rectangular shape with scarcely difference between the internal diameter and the external diameter.

Continuously, the method causes respective rectangular boards 31 to 3n to be regarded as the transmission lines to calculate both of the characteristic impedance Z0 and propagation delay time $\tau$ individually using general purpose impedance calculation tool and so forth, thus the method causes transmission line models 41 to 4n (process A3).

The each characteristic impedance Z0 and propagation delay time $\tau$ of respective rectangular boards is capable of being obtained by general purpose calculation expression or modeling tool from a current route flowing respective rectangular board with the condition that a part corresponding to outer periphery of the doughnut board is taken as width, and a part corresponding to a cut-length is taken as length. Here, description form of the transmission line model dealt with the SPICE simulator is that the characteristic impedance Z0 and propagation delay time $\tau$ thereof are inputted, the characteristic impedance Z0 and propagation delay time $\tau$ thereof in every unit line length and line length L are inputted, as a distributed constant, inductance L, resistance R, capacitance C in every line length and line length L are inputted.

Lastly, the respective transmission line models 41 to 4n are connected in series to make it simulation model 5 of the circuit board 1 (process A4).

Formed transmission line models 41 to 4n are connected in series, because there is no current route with the exception of the transmission line model 41 to 4n.

Figure 3:
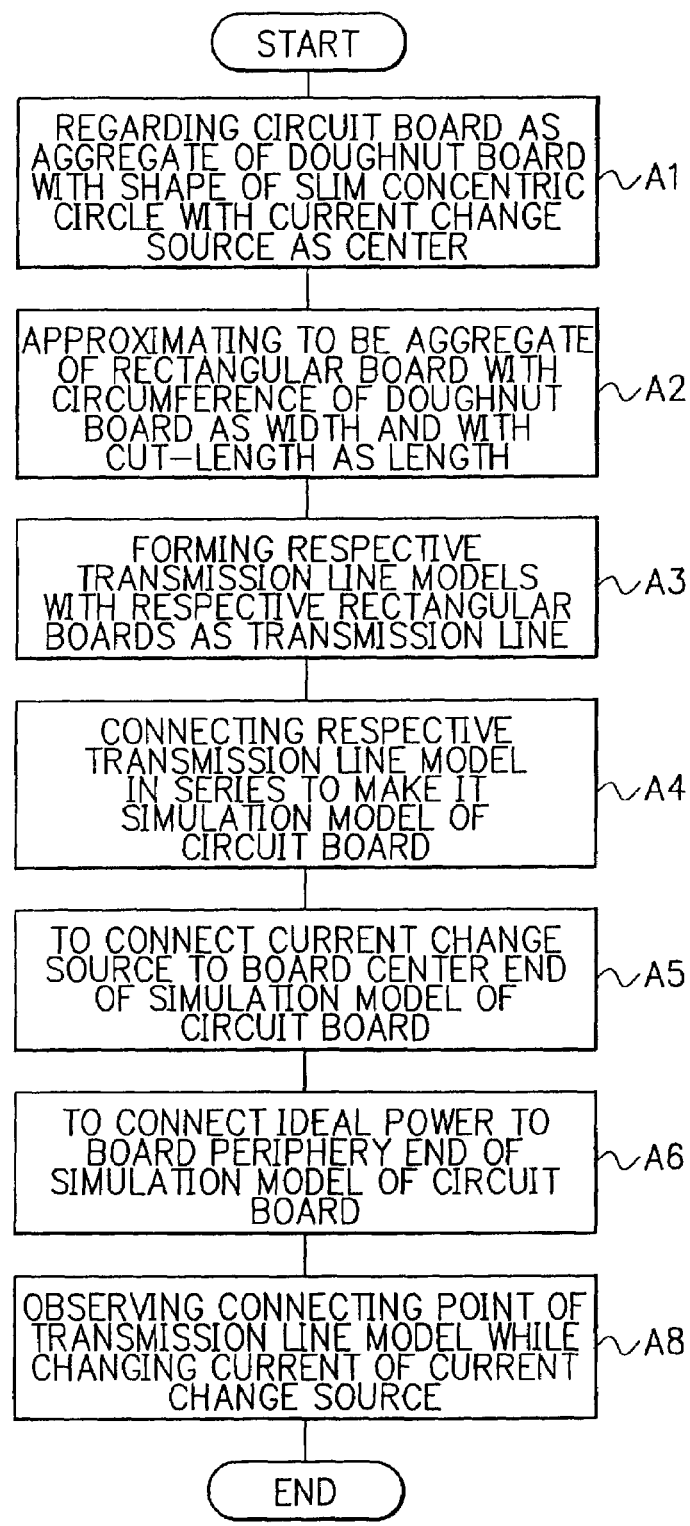
FIG. 3 is a flowchart showing process of order of the simulation method according to the first embodiment of the present invention.

FIG. 3 is a flowchart showing processes of order of simulation method according to the first embodiment of the present invention. The simulation method is that after the process A4 of the modeling method shown in FIG. 2, process A5 connecting a current change source to the board center end of the simulation model 5 of the circuit board 1, process A6 connecting ideal power to board outer periphery end of the simulation model 5 of the circuit board 1, and process A8 observing connection point of the transmission line model 41 to 4n while changing current of the current change source are added.

Figure 4:
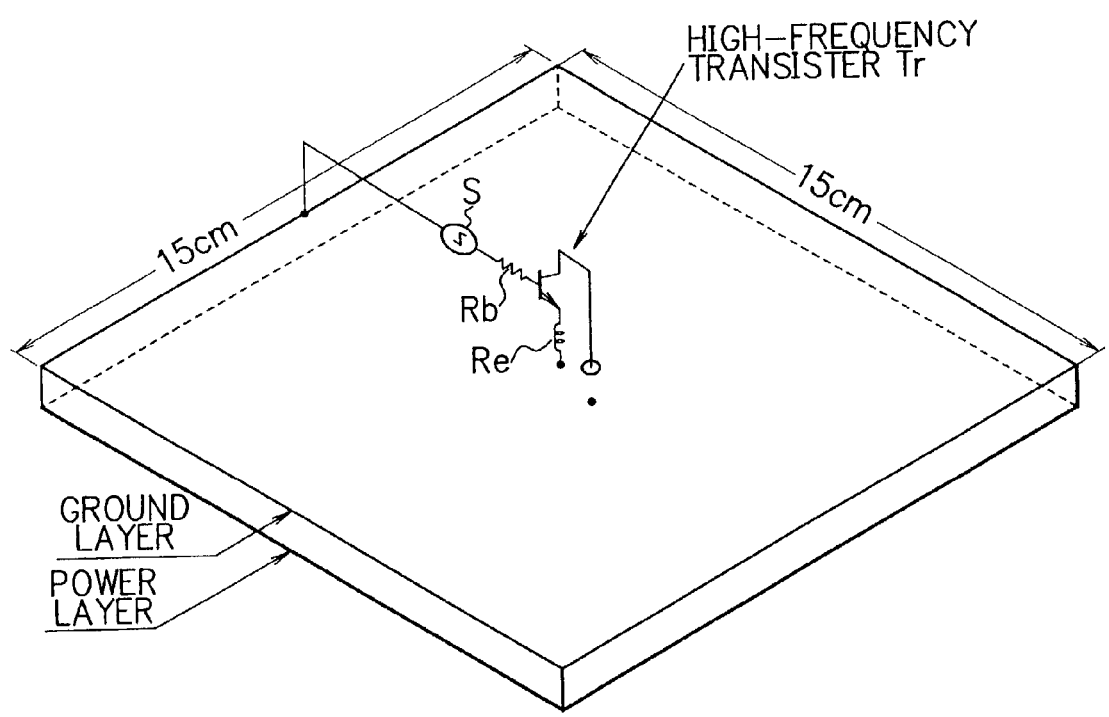
FIG. 4 is an image view sample to which the simulation method is applied according to the first embodiment of the present invention.

FIG. 4 is an image view showing one example of sample to which the simulation method according to the first embodiment of the present invention is applied. On the supposition that the sample is the structure on which the high frequency transistor is mounted as the current change source (switching element) at the center of the circuit board 1 with two even conductor layers 15 cm square.

The circuit board 1 is for instance, a square board with thickness of 1540 μm made of insulating material of dielectric constant 4.5. The board consist of a power layer and a ground layer made of copper of width of 30 μm in respective both sides. Outer periphery of the board is ideal power/ground without voltage fluctuation.

Next, the process is a modeling of individual parts consisting the sample.

In regard of the modeling of the circuit board 1, the modeling takes notice of the way of flowing of current according to switching of the high frequency transistor Tr. Concretely, in the power layer, the current flows into equally in the direction of the board center from the board outer periphery according to switching, while in the ground layer, the current equally flows inversely in the direction of the board outer periphery from the board center. Such the way of flowing of current is taken notice to regard the circuit board 1 as the aggregate of the thin doughnut boards 21 to 2n with concentric circle shape (process A1).

Figure 5:
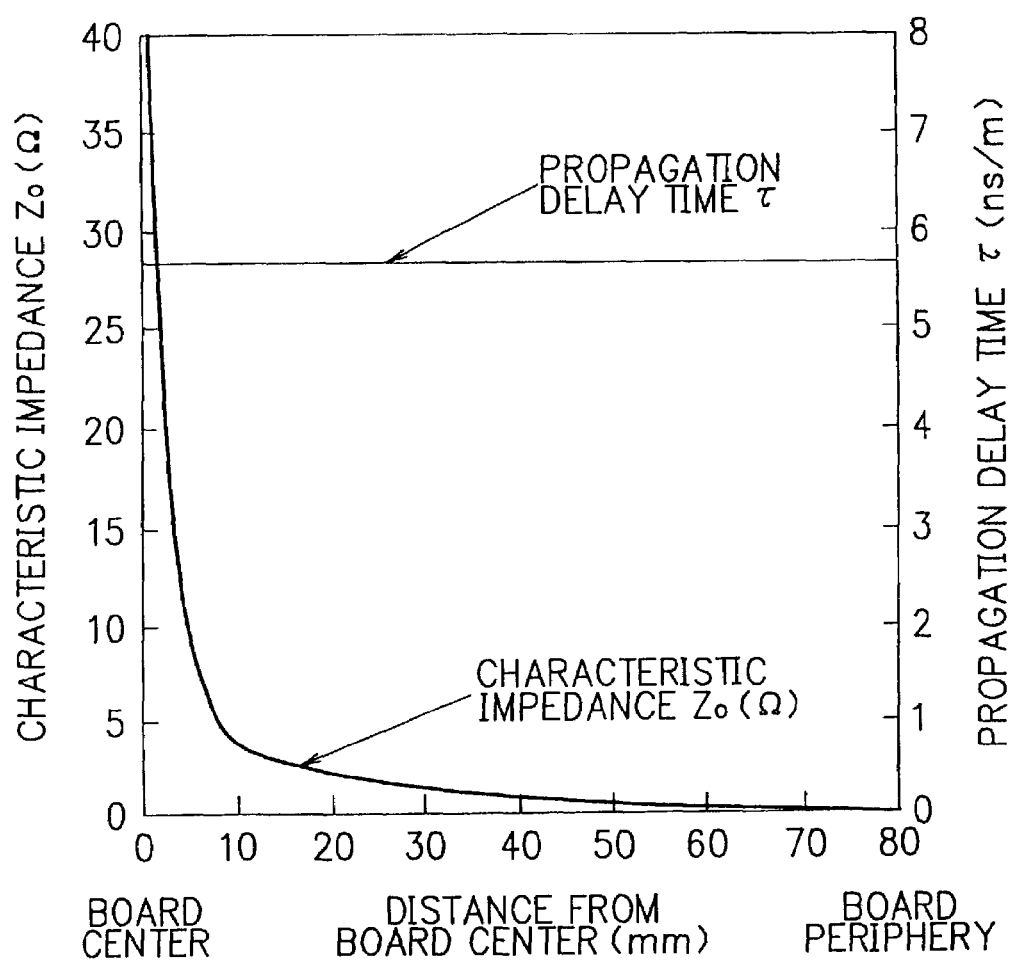
FIG. 5 is a graph showing characteristic impedance and propagation delay time of the circuit board shown in FIG. 4.

Here, the cut-length is set to be 5 mm (n=15) regarding the board outer periphery and the board center. Logically, precision ought to improve accompanying with the smaller cut-length, however as shown in FIG. 5, the characteristic impedance Z0 is near to 0Ω, thus it is not changed according to distance from the board center. Rough cut-length does not influence precision, while small change of distance from the center in the board center brings large change of characteristic impedance Z0, therefore, the cut-length to be small. Practically, cut-length of the board center is determined according to responsibility of transient analysis. It is incapable of being concluded sweepingly. The responsibility is magnitude of voltage drop when flowing the current transiently into the transmission line with large characteristic impedance Z0. In case where the responsibility is good, the characteristic impedance Z0 becomes large when rendering the cut-length of the board center too small, thus noise quantity becomes too large. For that reason, it is necessary to render the cut-length of the board center somewhat rough. To the contrary, when the responsibility is bad, it is necessary to render the cut-length of the board center small.

Next, the method causes the doughnut boards 21 to 2n to be approximate into the aggregate of the rectangular boards 31 to 3n with the outer periphery of the doughnut boards 21 to 2n as width, and with cut-length as length (process A2).

Here, the width is the outer periphery of the doughnut boards 21 to 2n when approximating the doughnut boards 21 to 2n as the rectangular transmission line. In general, voltage drop which is generated in the transmission line with micro length is determined roughly immediately when the current rushes in the transmission line. In the present embodiment, the current flows in the direction of the board center from the board outer periphery, thus the outer periphery of the doughnut board is taken as width.

Continuously, the process implemented regards each of the doughnut boards 21 to 2n as the transmission line, thus forming the transmission line models 41 to 4n while calculating the characteristic impedance Z0 and the propagation delay time τ individually using general purpose impedance calculation tool (process A3).

Then, the process connects the transmission line models 41 to 4n in series to make it the simulation model (circuit board model) 5 of the circuit board 1 (process A4).

FIG. 5 is a graph showing distribution of both of the characteristic impedance Z0 and the propagation delay time τ of the circuit model 5. The characteristic impedance Z0 is close to 0Ω nearby board outer periphery, however the characteristic impedance Z0 becomes high suddenly nearby center. Further, the propagation delay time τ is fixed because the propagation delay time τ is determined according to the dielectric constant of insulating material.

Next, in regard to modeling of high frequency transistor Tr, general purpose transistor model is substituted for the high frequency transistor model.

Figure 6:
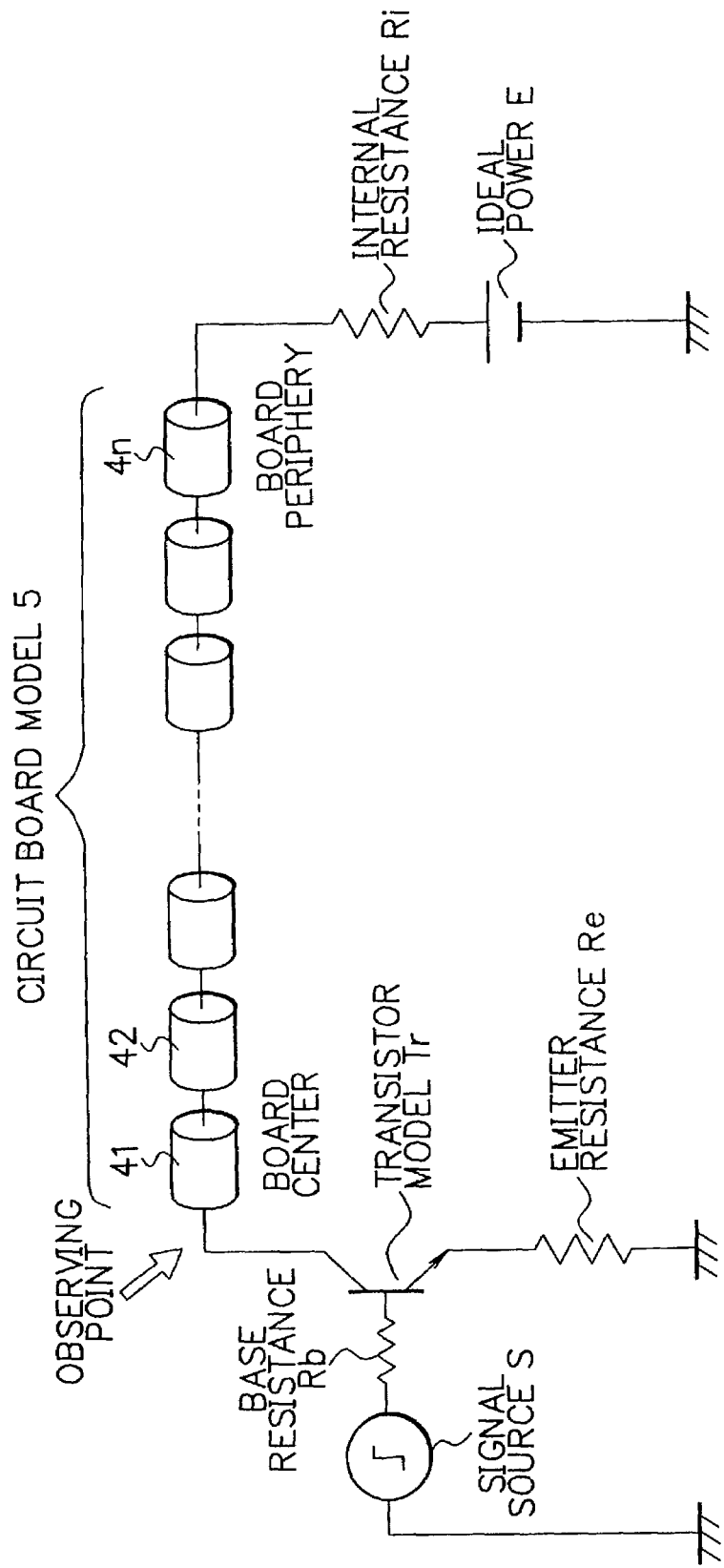
FIG. 6 is circuit diagram showing one example of simulation model of sample shown in FIG. 4.

FIG. 6 is a circuit view showing one example of simulation model of a sample.

Firstly, the process connects the transistor model Tr and emitter resistance Re between center end of the circuit board model 5 and the ground in series (process A5). Concretely, collector of the transistor model Tr is connected to the board center end, further, emitter of the transistor model Tr is connected to the emitter resistance Re, and the emitter resistance Re is connected to the ground. Furthermore, base of the transistor model Tr is connected to the base resistance Rb, the base resistance Rb is connected to signal source S, and the signal source S is connected to the ground.

Next, the process connects the internal resistance Ri and ideal power E between the board outer periphery end of the circuit board model 5 and the ground (process A6).

Thus the process implements the simulation using the simulation model of such the sample. The simulation method is that it gives signal from the signal source S to the base of the transistor model Tr. When the simulation method causes the transistor model Tr to perform switching in high speed, the process observes power/ground noise occurring between the collector (board center end) of the transistor model Tr and the ground (process A8). Moreover, the observation point is capable of being made voluntary connection point of the transmission line models 41 to 4n.

Figure 7:
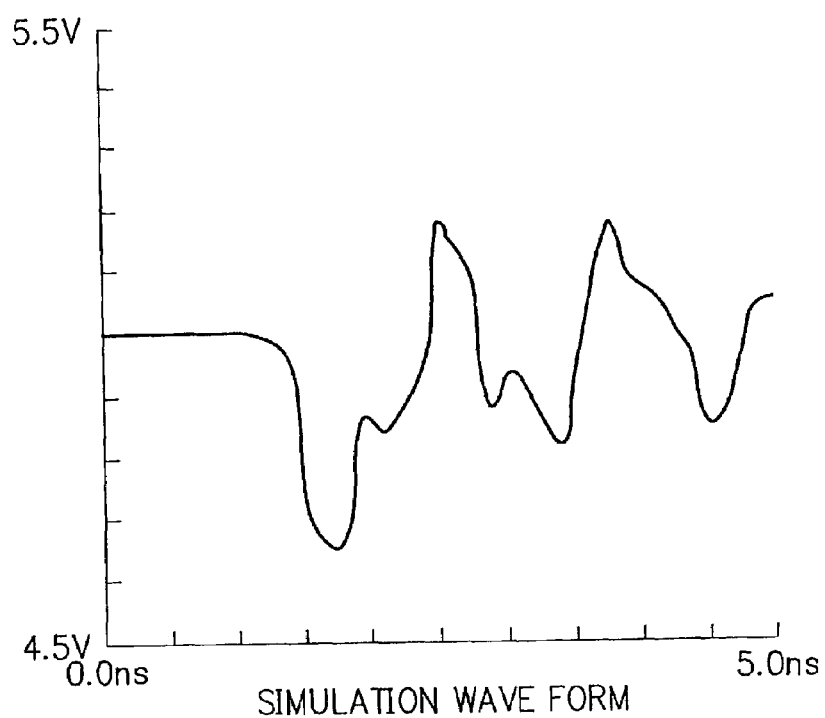
FIG. 7 is a wave form view showing simulation wave form of power/ground noise of the sample shown in FIG. 4.

FIG. 7 is a view showing one example of wave form from result of the simulation.

In order to confirm validity of an analysis result of the power/ground noise according to the simulation method regarding the present embodiment, the method experiments using the sample with the same shape and the same configuration, so as to compare with experimentation result.

Firstly, a plurality of ceramic capacitors and tantalum capacitors are mounted on the outer periphery of the circuit board 1 of conductor two-layer flat surface with 15 cm square, further, being supplied power/ground according to external stabilized power. Here, the board outer periphery becomes state where voltage fluctuation nearly equals zero (0) due to the ceramic capacitor and the tantalum capacitor.

Next, the high frequency transistor is mounted on the board center as the switching element. The experimentation causes the high frequency transistor to perform switching in high speed from the outer section, thus flowing current including a great deal of high frequency component from the power layer to the ground layer in the board center.

Noise occurs in power layer/ground layer caused by both of the change current quantity Δi and the impedance Z existing in the power layer/ground layer, thus observing the noise by the wide band oscilloscope.

Figure 8:
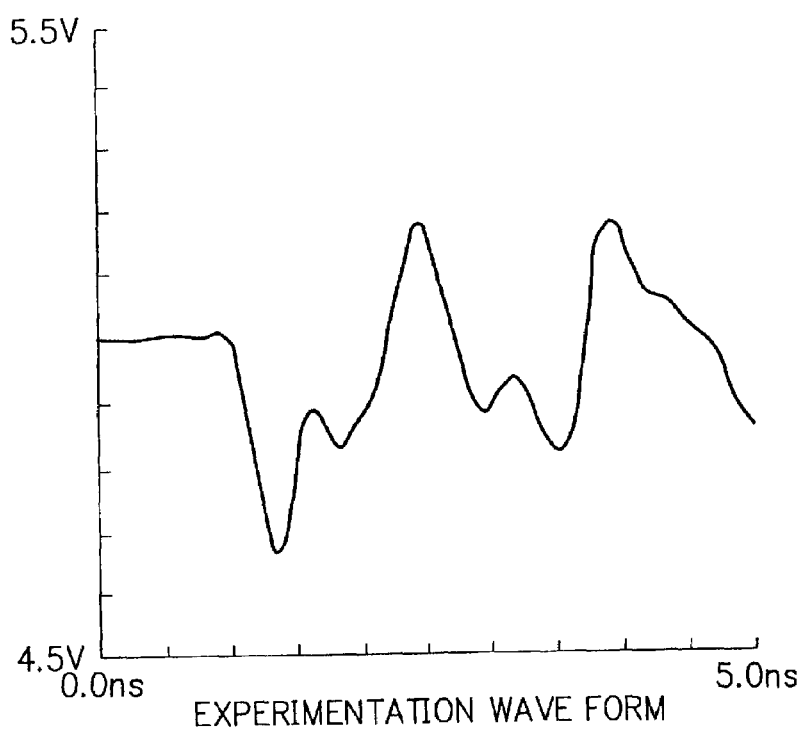
FIG. 8 is a wave form view showing experimentation wave form of power/ground noise of the sample shown in FIG. 4.

FIG. 8 is a view showing one example of experimentation wave form. As is clear understanding from comparison the experimentation wave form with the simulation wave form of FIG. 7, the simulation is analogous to the experimentation in regard both to the noise level and the wave form.

Next, comparison is carried out between simulation time according to the simulation method of the present embodiment and simulation time of the case where conventional general purpose modeler is used. The comparison is that the later causes the circuit board 1 to undergo modeling with matrix shape by the general purpose modeler, thus the same simulation is executed. With the result that the simulation time of the case where the modeling method of the present embodiment is used is some seconds, while the simulation time of the case where the general purpose modeler is used is about five hours.

As the general purpose modeler, Apsim PLANE (made by Apsim company) is used. The modeling of the circuit board of Apsim PLANE is that the connection points called node are connected by electrical elements such as inductance L, capacitance C, resistance R, mutual inductance K, and voltage control voltage source E, with each other to be constituted, thus the modeling is implemented. According to this method, mutual connection becomes complicated in case of a lot of node number, therefore, a great deal of analysis time is required. If the worst comes to the worst, it does not converge by the SPICE simulator, thus there is the possibility of abort.

Figure 9:
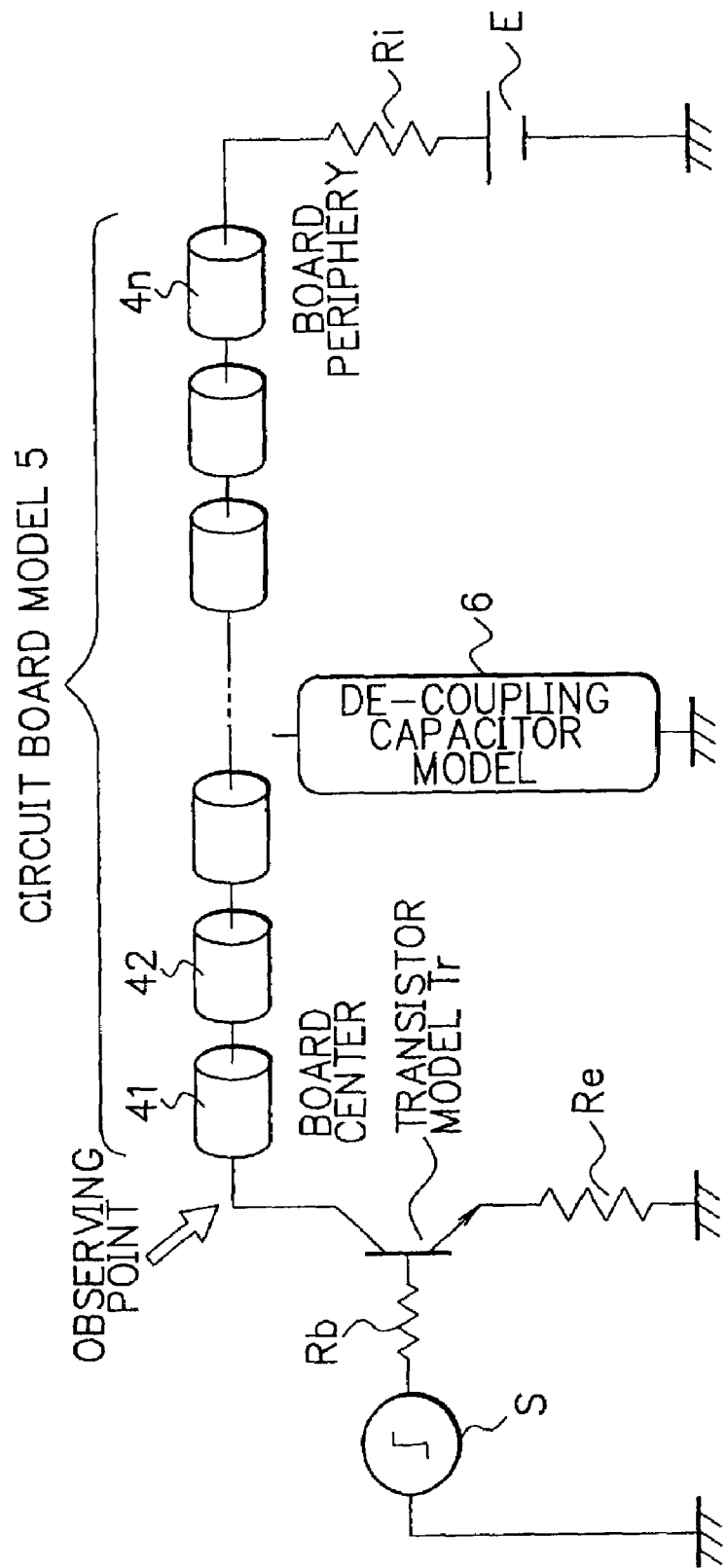
FIG. 9 is a circuit diagram showing another example of simulation model of the sample shown in FIG. 4.

FIG. 9 is a circuit view showing another example of the simulation model of a sample. The simulation model of this sample mounts the simulation model (de-coupling capacitor model) 6 of the de-coupling capacitor in the periphery of the transistor model Tr against circuit view of the simulation model of the sample shown in FIG. 6.

The de-coupling capacitor model 6 consists of series circuit of the inductance L, the capacitance C, and the resistance R, which series circuit is a general equivalent circuit of capacitor. Then, the respective values are determined in such a way that the simulation is implemented such that the frequency characteristic of the impedance becomes equal to that of the ceramic capacitor.

Figure 10:
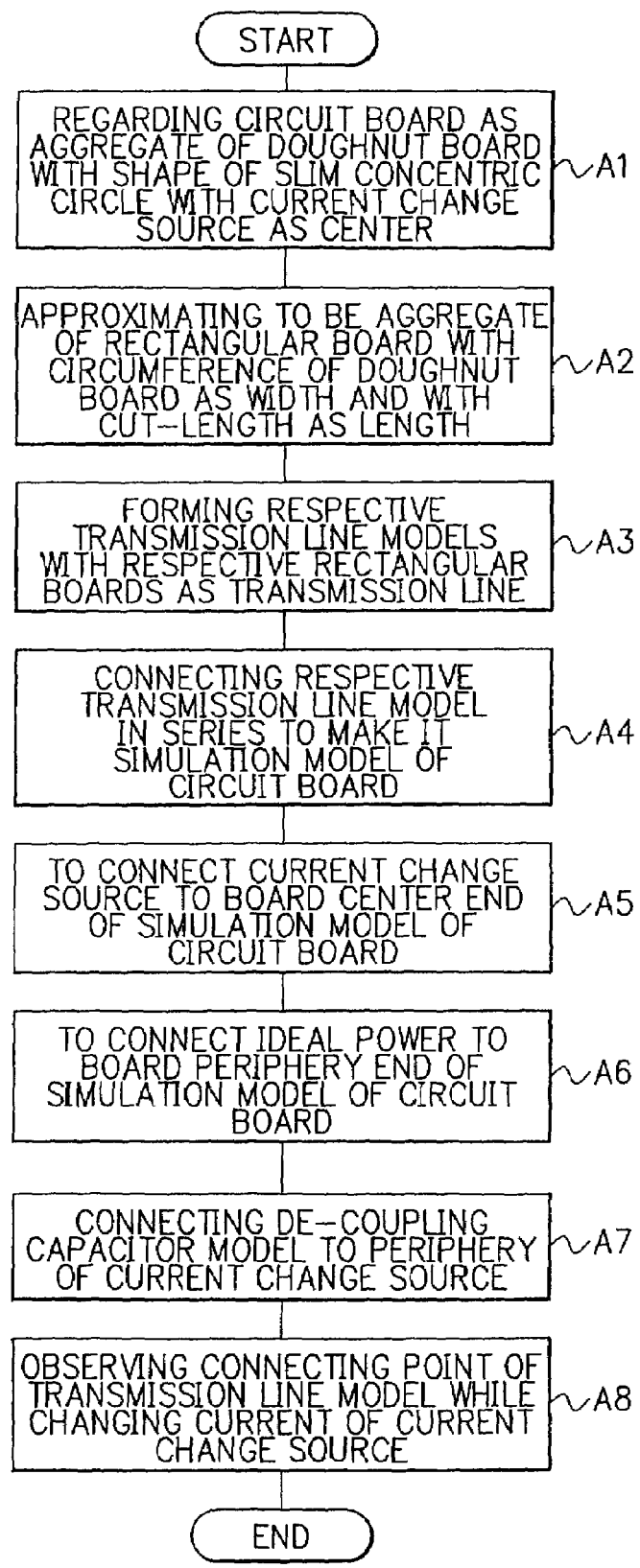
FIG. 10 is a flowchart showing processes of order of the case where in the simulation method according to the first embodiment of the present invention, de-coupling capacitor is mounted in the periphery of the transistor model.

FIG. 10 shows the simulation method in which such the de-coupling capacitor model 6 is mounted in the periphery of the transistor model Tr. As shown in FIG. 10, the process A7 is added between the process A6 and the process A8 of the simulation method shown in FIG. 3. The process A7 is to connect the de-coupling capacitor model 6 to the periphery of the current change source.

Figures 11, 12:
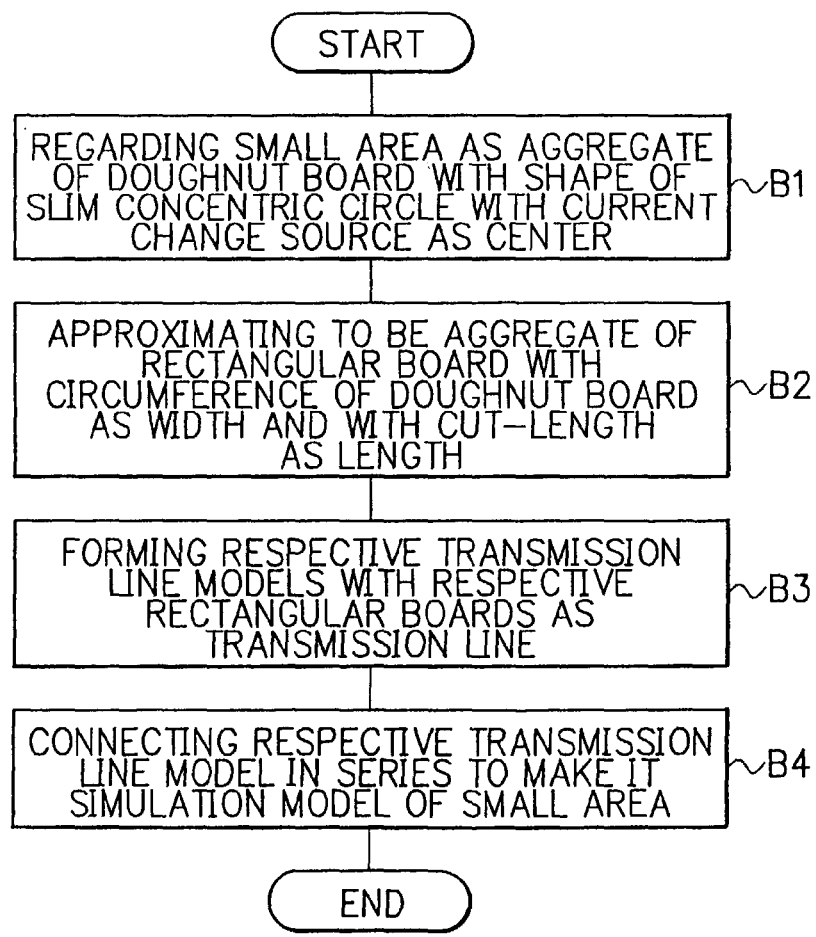
FIG. 11 is a view showing comparison simulation result of noise level in accordance with position of the de-coupling capacitor in the simulation model of sample shown in FIG. 9 with experimentation result.
FIG. 12 is a flowchart showing processes of order of modeling method according to a second embodiment of the present invention.

The comparison of the noise level of the case where the de-coupling capacitor model 6 is added brings excellent result as shown in FIG. 11.

Now, in the above first embodiment, the modeling method for forming simulation model of a circuit board and the simulation method for using thereof are described when analyzing the power/ground noise of the circuit board with single current change source by the circuit simulator. A small area of circuit board with the current change source as center is capable of being regarded as the circuit board with the single current change source, the present invention can be applied to the modeling method for forming simulation model of the small area of circuit board and the simulation method for using thereof when analyzing the power/ground noise of the small area of circuit board with the current change source as the center by the circuit simulator.

FIG. 12 is a flowchart showing processes of order of modeling method according to a second embodiment applied to a small area of circuit board with current change source as center. The modeling method comprises a process B1 for regarding the small area of circuit board as aggregate of the doughnut boards 21 to 2n having thin concentric circle with current change source as a center, a process B2 for approximating the doughnut board as aggregate of rectangular boards 31 to 3n with respective circumferences of the doughnut boards 21 to 2n as the widths, and respective cut-length of the same as the lengths thereof, a process B3 for forming respective transmission line models 41 to 4n with respective rectangular boards 31 to 3n as the transmission line, and a process B4 connecting respective transmission line models 41 to 4n to make it simulation model 5 of the small area of circuit board.

Figure 13:
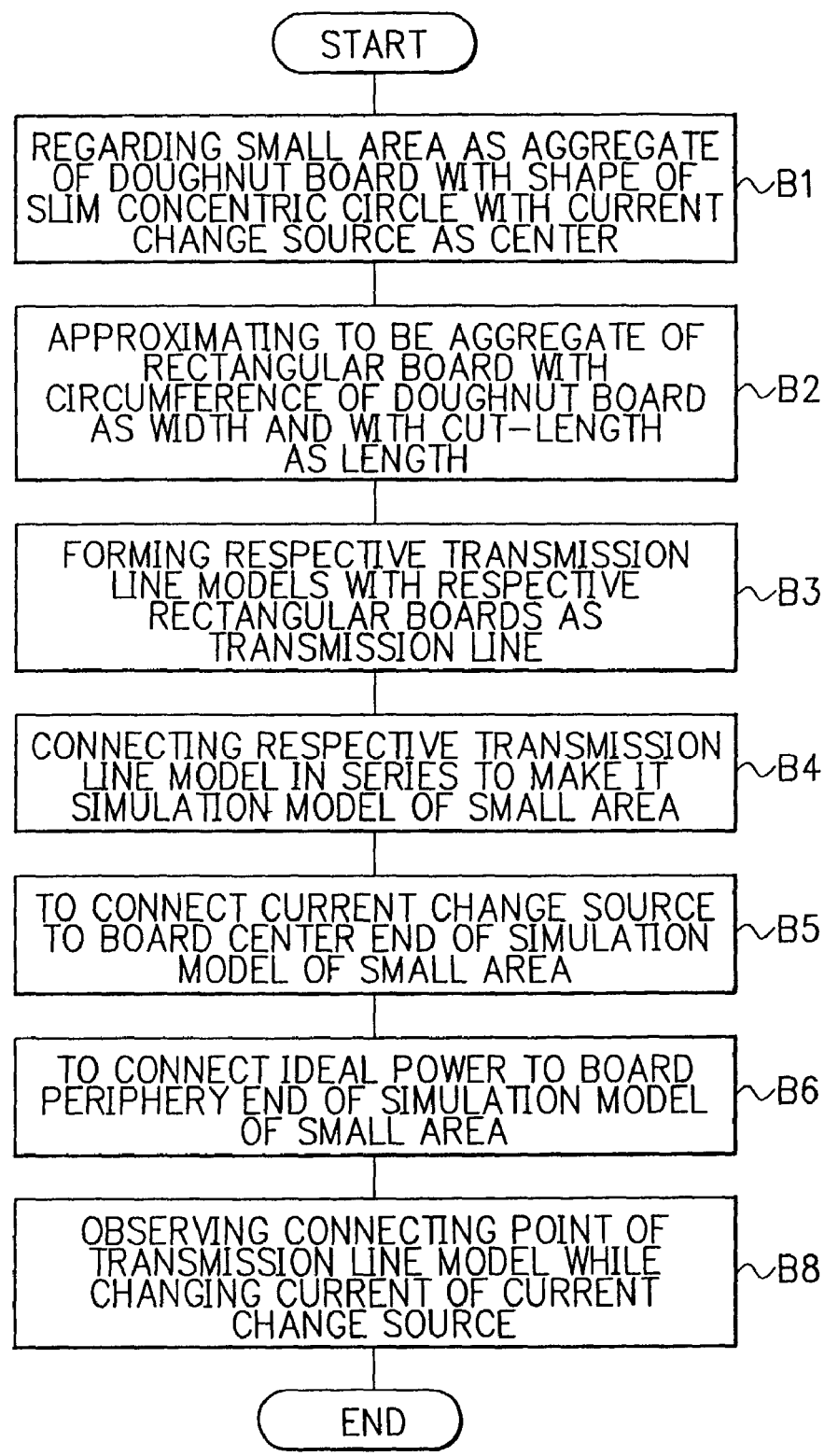
FIG. 13 is a flowchart showing processes of order of simulation method according to the second embodiment of the present invention.

Further, FIG. 13 is a flowchart showing processes of order of simulation method according to the second embodiment of the present invention applied to the small area of circuit board with the current change source as the center. The simulation method is that after the process B4 of the modeling method shown in FIG. 12, process B5 connecting a current change source to the area center end of the simulation model 5 of the small area of circuit board, process B6 connecting ideal power to area outer periphery end of the simulation model 5 of the small area of circuit board, and process B8 observing connection point of the transmission line model 41 to 4n while changing current of the current change source are added.

Figure 14:
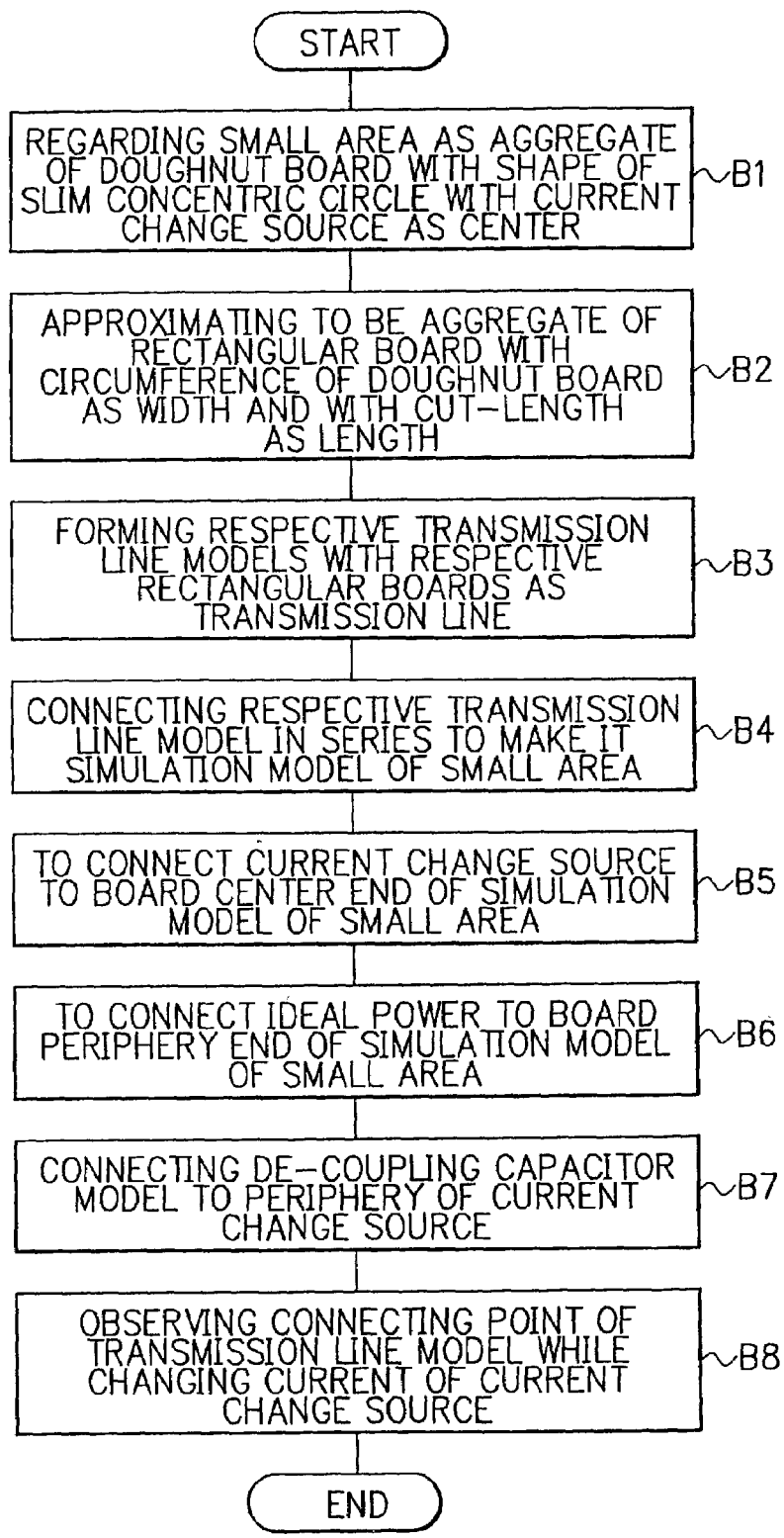
FIG. 14 is a flowchart showing processes of order of the case where in the simulation method according to the second embodiment, the decoupling capacitor model is mounted in the periphery of the transistor model.

FIG. 14 shows the simulation method in which such the de-coupling capacitor model 6 is mounted in the periphery of the transistor model Tr. As shown in FIG. 14, the process B7 is added between the process B6 and the process B8 of the simulation method shown in FIG. 13. The process B7 is to connect the de-coupling capacitor model 6 to the periphery of the current change source.

Next, a third embodiment of the present invention will be described in accordance with the accompanying drawing.

Figure 15:
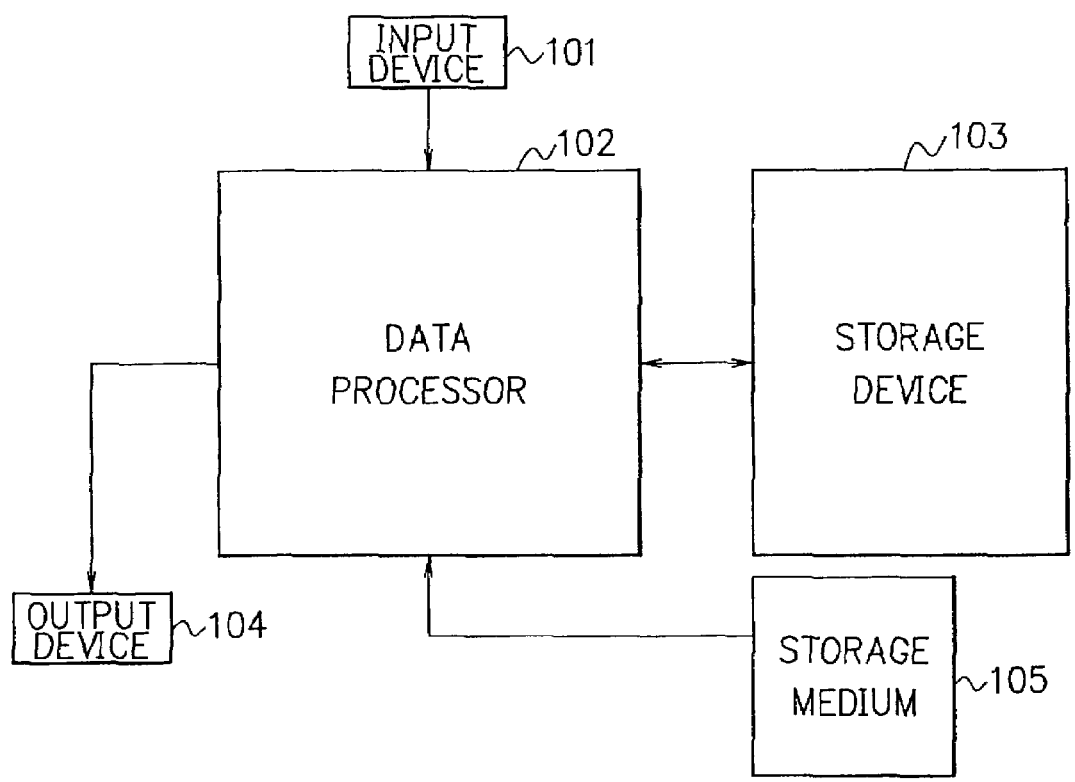
FIG. 15 is a block diagram showing hardware configuration applied to the modeling method and the simulation method according to a third embodiment of the present invention.

Referring to FIG. 15, the third embodiment of the present invention comprises an input device 101 of keyboard, mouse and so forth, a data processor 102 consisting of a computer, a storage device 103 of a hard disk device and so forth, an output device 104 of an image display device, a printing device and so forth, and a storage medium 105 storing therein a modeling program or a simulation program. The storage medium 105 is a storage medium such as a magnetic disk, a semiconductor memory, and so forth.

In the third embodiment of the present invention constituted above, the modeling program or the simulation program is read from the storage medium 105 for the data processor 102. The data processor 102 operates in accordance with the order of the processes (procedure) shown in FIGS. 2, 3, 10, 12, 13, or 14. Consequently, the modeling method and simulation method according to the third embodiment are implemented in the same way as the modeling method and the simulation method according to the first embodiment or the second embodiment, therefore, detailed description is omitted.

In the above respective embodiments, description is that the representation of the circuit simulator is the SPICE simulator, however, necessary condition of the circuit simulator capable of being used in the present invention is that a circuit simulator can only deal with a transmission line model.

A first effect of the present invention is that it is capable of making a scale of the simulation model of the circuit board smaller. Because the modeling method comprises a process for regarding the circuit board as aggregate of the doughnut boards having thin concentric circle with current change source as a center, a process for approximating the doughnut board as aggregate of rectangular boards with respective circumferences of the doughnut boards as the width, and respective cut-length of the same as the length thereof, a process for forming respective transmission line models with respective rectangular boards as the transmission line, and a process connecting respective transmission line models to make it simulation model of the circuit board. Therefore it is not necessary to implement the modeling with matrix shape.

A second effect is that it is capable of reducing a scale of the simulation model of the micro-region. Because the modeling method comprises a process for regarding the small area of circuit board as aggregate of the doughnut boards having thin concentric circle with current change source as a center, a process for approximating the doughnut board as aggregate of rectangular boards with respective circumferences of the doughnut boards as the width, and respective cut-length of the same as the lengths thereof, a process for forming respective transmission line models with respective rectangular boards as the transmission line, and a process connecting respective transmission line models to make it simulation model of the small area of circuit board. Therefore it is not necessary to implement the modeling with matrix shape.

A third effect is that it is capable of reducing execution time of the simulation while reducing a scale of the simulation model of the circuit board without deteriorating simulation precision. Because the modeling method comprises a process for regarding the circuit board as aggregate of the doughnut boards having thin concentric circle with current change source as a center, a process for approximating the doughnut board as aggregate of rectangular boards with respective circumferences of the doughnut boards as the widths, and respective cut-lengths as the lengths thereof, a process for forming respective transmission line models with respective rectangular boards as the transmission line, a process connecting respective transmission line models to make it simulation model of the circuit board, a process connecting a current change source to the board center end of the simulation model of the circuit board, a process connecting ideal power to board outer periphery end of the simulation model of the circuit board, and a process observing connection point of the transmission line models while changing current of the current change source are added.

Therefore it is capable of executing the simulation of the power/ground noise of the circuit board without deterioration of simulation precision even though it does not implement the modeling with matrix shape.

A fourth effect is that it is capable of reducing execution time of the simulation while reducing a scale of the simulation model of the circuit board without deteriorating simulation precision. Because the modeling method comprises a process for regarding the circuit board as aggregate of the doughnut boards having thin concentric circle with current change source as a center, a process for approximating the doughnut board as aggregate of rectangular boards with respective circumferences of the doughnut boards as the widths, and respective cut-length of the same as the lengths thereof, a process for forming respective transmission line models with respective rectangular boards as the transmission line, a process connecting respective transmission line models to make it simulation model of the circuit board a process connecting a current change source to the board center end of the simulation model of the circuit board, a process connecting ideal power to board outer periphery end of the simulation model of the circuit board, a process for connecting the de-coupling capacitor model with periphery of the current change source, and a process observing connection point of the transmission line models while changing current of the current change source are added. Therefore it is capable of executing the simulation of the power/ground noise of the circuit board without deterioration of simulation precision even though it does not implement the modeling with matrix shape.

A fifth effect is that it is capable of reducing execution time of the simulation while reducing a scale of the simulation model of the small area of circuit board without deteriorating simulation precision. Because the modeling method comprises a process for regarding the small area of circuit board as aggregate of the doughnut boards having thin concentric circle with current change source as a center, a process for approximating the doughnut board as aggregate of rectangular boards with respective circumferences of the doughnut boards as the widths, and respective cut-length of the same as the lengths thereof, a process for forming respective transmission line models with respective rectangular boards as the transmission line, a process connecting respective transmission line models to make it simulation model of the small area of circuit board a process connecting a current change source to the board center end of the simulation model of the circuit board, a process connecting ideal power to the small area of circuit board outer periphery end of the simulation model of the small area of circuit board, and a process observing connection point of the transmission line models while changing current of the current change source are added. Therefore it is capable of executing the simulation of the power/ground noise of the small area of circuit board without deterioration of simulation precision even though it does not implement the modeling with matrix shape.

A sixth effect is that it is capable of reducing execution time of the simulation while reducing a scale of the simulation model of the small area of circuit board without deteriorating simulation precision. Because the modeling method comprises a process for regarding the small area of circuit board as aggregate of the doughnut boards having thin concentric circle with current change source as a center, a process for approximating the doughnut board as aggregate of rectangular boards with respective circumferences of the doughnut boards as the widths, and respective cut-length of the same as the lengths thereof, a process for forming respective transmission line models with respective rectangular boards as the transmission line, a process connecting respective transmission line models to make it simulation model of the small area of circuit board a process connecting a current change source to the board center end of the simulation model of the circuit board, a process connecting ideal power to the small area of circuit board outer periphery end of the simulation model of the small area of circuit board, a process for connecting the de-coupling capacitor model with the circumpherences of the current change source, and a process observing connection point of the transmission line models while changing current of the current change source are added. Therefore it is capable of executing the simulation of the power/ground noise of the small area of circuit board without deterioration of simulation precision even though it does not implement the modeling with matrix shape.

What is claimed is:

1. A modeling method in which a simulation model of a circuit board with single current change source is formed when analyzing power/ground noise of the circuit board by a circuit simulator, comprising the processes of:

regarding said circuit board as an aggregate of doughnut boards having a form of thin concentric circles with said current change source as a center;

approximating said aggregate of doughnut boards to an aggregate of rectangular boards with respective circumferences of the doughnut boards as widths and respective cut-lengths of the same as lengths;

forming a transmission line model for each rectangular board in said aggregate of rectangular boards while each rectangular board is a transmission line;

and connecting said transmission line models in series to make said simulation model of said circuit board.

2. A modeling method in which a simulation model of a small area of circuit board having a current change source at a center is formed when analyzing power/ground noise of the small area of circuit board by a circuit simulator, comprising the processes of:

regarding said small area of circuit board as an aggregate of doughnut boards having a form of thin concentric circles with said current change source as a center;

approximating said aggregate of doughnut boards to an aggregate of rectangular boards with respective circumferences of the doughnut boards as widths and respective cut-lengths of the same as lengths;

forming a transmission line model for each rectangular board in said aggregate of rectangular boards while each rectangular board is a transmission line; and connecting said transmission line models in series to make said simulation model of said small area of circuit board.

3. A simulating method in which a simulation model of a circuit board with one current change source is formed, and a simulation of power/ground noise of said circuit board is executed by a circuit simulator, comprising the processes of:

regarding said circuit board as an aggregate of doughnut boards having a form of thin concentric circles with said current change source as a center;

approximating said aggregate of doughnut boards to an aggregate of rectangular boards with respective circumferences of the doughnut boards as widths and respective cut-lengths of the same as lengths;

forming a transmission line model for each rectangular board in said aggregate of rectangular boards while each rectangular board is a transmission line;

connecting said transmission line models in series to make said simulation model of said circuit board;
connecting said current change source to a board center end of said simulation model of said circuit board;
connecting an ideal power to a board periphery end of said simulation model of said circuit board;
and observing connecting points of said transmission line models while changing the current of said current change source.

4. A simulating method in which a simulation model of a small area of circuit board having a current change source at a center is formed, and a simulation of power/ground noise of said small area of circuit board is executed by a circuit simulator, comprising the processes of:
regarding said small area of circuit board as an aggregate of doughnut boards having a form of thin concentric circles with said current change source as a center;
approximating said aggregate of doughnut boards to an aggregate of rectangular boards with respective circumferences of the doughnut boards as widths and respective cut-lengths of the same as lengths;
forming a transmission line model for each rectangular board in said aggregate of rectangular boards while each rectangular board is a transmission line;
connecting said transmission line models in series to make said simulation model of said small area of circuit board;
connecting said current change source to a region center end of said simulation model of said small area of circuit board;
connecting an ideal power to a region periphery end of said simulation model of said small area of circuit board;
and observing connecting points of said transmission line models while changing the current of said current change source.

5. A simulating method as claimed in claim 3, wherein said power change source is formed by a transistor model.

6. A simulating method as claimed in claim 4, wherein said power change source is formed by a transistor model.

7. A computer program product embodied on a computer-readable medium and comprising code that, when executed, causes a computer to perform the following:
regarding a circuit board with one current change source as an aggregate of doughnut boards having a form of thin concentric circles with said current change source as a center;
approximating said aggregate of doughnut boards to an aggregate of rectangular boards with respective circumferences of the doughnut boards as widths and respective cut-lengths of the same as lengths;
forming a transmission line model for each rectangular board in said aggregate of rectangular boards while each rectangular board is a transmission line; and
connecting said transmission line models in series to make a simulation model of said circuit board.

8. A computer program product embodied on a computer-readable medium and comprising code that, when executed, causes a computer to perform the following:
regarding a small area of circuit board having a current change source at a center as an aggregate of doughnut boards having a form of thin concentric circles with said current change source as a center;
approximating said aggregate of doughnut boards to an aggregate of rectangular boards with respective circumferences of the doughnut boards as widths and respective cut-lengths of the same as lengths;
forming a transmission line model for each rectangular board in said aggregate of rectangular boards while each rectangular board is a transmission line; and
connecting said transmission line models in series to make a simulation model of said small area of circuit board.

9. A computer program product embodied on a computer-readable medium and comprising code that, when executed, causes a computer to perform the following:
regarding a circuit board with one current change source as an aggregate of doughnut boards having a form of thin concentric circles with said current change source as a center;
approximating said aggregate of doughnut boards to an aggregate of rectangular boards with respective circumferences of the doughnut boards as widths and respective cut-lengths of the same as lengths;
forming a transmission line model for each rectangular board in said aggregate of rectangular boards while each rectangular board is a transmission line;
connecting said transmission line models in series to make a simulation model of said circuit board;
connecting said current change source to a board center end of said simulation model of said circuit board;
connecting an ideal power to a board periphery end of said simulation model of said circuit board; and
observing connecting points of said transmission line models while changing the current of said current change source.

10. A computer program product embodied on a computer-readable medium and comprising code that, when executed, causes a computer to perform the following:
regarding a small area of circuit board having a current change source at a center as an aggregate of doughnut boards having a form of thin concentric circles with said current change source as a center;
approximating said aggregate of doughnut boards to an aggregate of rectangular boards with respective circumferences of the doughnut boards as widths and respective cut-lengths of the same as lengths;
forming a transmission line model for each rectangular board in said aggregate of rectangular boards while each rectangular board is a transmission line;
connecting said transmission line models in series to make a simulation model of said small area of circuit board;
connecting said current change source to a region center end of said simulation model of said small area of circuit board;
connecting an ideal power to a region periphery end of said simulation model of said small area of circuit board; and
observing connecting points of said transmission line models while changing the current of said current change source.

* * * * *